United States Patent
Ogawa

(10) Patent No.: US 10,868,528 B2
(45) Date of Patent: Dec. 15, 2020

(54) SIGNAL OUTPUT DEVICE

(71) Applicant: UltraMemory Inc., Tokyo (JP)

(72) Inventor: Naoki Ogawa, Tokyo (JP)

(73) Assignee: ULTRAMEMORY INC., Tokyo (JP)

(*) Notice: Subject to any disclaimer, the term of this patent is extended or adjusted under 35 U.S.C. 154(b) by 0 days.

(21) Appl. No.: 16/645,392

(22) PCT Filed: Sep. 8, 2017

(86) PCT No.: PCT/JP2017/032507
§ 371 (c)(1),
(2) Date: Mar. 6, 2020

(87) PCT Pub. No.: WO2019/049320
PCT Pub. Date: Mar. 14, 2019

(65) Prior Publication Data
US 2020/0287529 A1 Sep. 10, 2020

(51) Int. Cl.
*H03K 5/24* (2006.01)
(52) U.S. Cl.
CPC ...................... *H03K 5/24* (2013.01)
(58) Field of Classification Search
CPC .... G01R 19/00; G01R 19/0038; G01R 19/04; G01R 19/30; G11B 20/00; G11B 20/10009; H03K 5/00; H03K 5/1532; H03K 5/24
USPC ........................................................ 327/62
See application file for complete search history.

(56) References Cited

U.S. PATENT DOCUMENTS

| | | | |
|---|---|---|---|
| 2009/0212826 | A1 | 8/2009 | Mizunaga |
| 2012/0007438 | A1 | 1/2012 | Kuroda |
| 2014/0375355 | A1 | 12/2014 | Saito |

FOREIGN PATENT DOCUMENTS

| | | | |
|---|---|---|---|
| JP | 2008-278257 A | 11/2008 |
| JP | 2009-200944 A | 9/2009 |
| JP | 2010-056593 A | 3/2010 |
| JP | 2015-008424 A | 1/2015 |

OTHER PUBLICATIONS

International Search Report and Written Opinion (with English translation) dated Nov. 21, 2017 issued in corresponding Application No. PCT/JP2017/032507.

*Primary Examiner* — Lincoln D Donovan
*Assistant Examiner* — Dave Mattison
(74) *Attorney, Agent, or Firm* — Muncy, Geissler, Olds & Lowe, P.C.

(57) ABSTRACT

Provided is a signal output device capable of appropriately outputting a signal even when a received signal amount is low. A signal output device is provided with: a high-side comparator; a low-side comparator; a high-side AC coupling unit which is connected to one end of the input terminal of the high-side comparator, and removes a DC component from either a high signal or a low signal; a low-side AC coupling unit which is connected to one end of the input terminal of the low-side comparator, and removes a DC component from either a high signal or a low signal; and a threshold output unit which outputs high-side threshold DC voltage to be combined with the output of the high-side AC coupling unit, and also outputs low-side threshold DC voltage to be combined with the output of the low-side AC coupling unit.

7 Claims, 4 Drawing Sheets

SIGNAL OUTPUT DEVICE

TECHNICAL FIELD

The present invention relates to a signal output device.

BACKGROUND ART

In the related art, a signal output device using a hysteresis comparator is known. The signal output device using the hysteresis comparator can hold a data of a previous cycle in a case where a signal does not change by inputting a signal waveform of a received signal to the hysteresis comparator. In addition, since the signal output device also has a hysteresis characteristic, the signal output device has a characteristic that the signal output device does not receive signal ringing noise or a minute voltage difference caused by noise.

On the other hand, when the signal amount of the received signal is small (when the voltage of the signal is low), the hysteresis comparator cannot invert the output unless an input voltage difference equal to or greater than the hysteresis width occurs. Therefore, a signal output device in which an amplifier (current mode logic (CML)) is provided on the front stage of the hysteresis comparator has been proposed (see, for example, Patent Document 1). In addition, there is also known a signal output device that can reduce the influence of output on variations of a received signal (see, for example, Patent Document 2).

Patent Document 1: Japanese Unexamined Patent Application, Publication No. 2010-56593 Patent Document 2: Japanese Unexamined Patent Application, Publication No. 2009-200944

DISCLOSURE OF THE INVENTION

Problems to be Solved by the Invention

In the signal output device disclosed in Patent Document 1, the hysteresis width is determined according to a ratio between a current of the CML and a current of the hysteresis comparator. In order to adjust an optimum hysteresis width with respect to the signal amount, it is necessary to adjust the CML and the level of the hysteresis comparator to be fit to an optimum current ratio. In a case where the received signal amount is small, the hysteresis width needs to be reduced by reducing the current of the hysteresis comparator. However, if the current of the hysteresis comparator is excessively reduced, there is a problem that hysteresis characteristics cannot be obtained. In addition, in a case where a plurality of signal output devices are used, the optimum values in the respective signal amplification circuits are different due to variations in voltages of metal-oxide-semiconductor field-effect transistors (MOSFETs). Furthermore, there is a problem that current adjustment becomes more difficult when a DC offset occurs due to the variations in voltages of the two MOSFETs.

The signal output device disclosed in Patent Document 2 includes a high detection comparator, a low detection comparator, and a latch circuit. An output signal from a port on a positive side of a coil as a receiving means and a voltage higher or lower than a coil bias generated by a ladder resistor circuit are input to an input of the comparator.

In a case where the relationship of input voltages is inverted, both the high detection comparator and the low detection comparator output high and output the output to the latch circuit. Compared with the signal output device disclosed in Patent Document 1, the DC offset is controlled by the ladder resistor circuit, and the number of MOSes and the number of amplifier stages are also small, so that there is an advantage in that the influence on the variations of the output signal is small.

On the other hand, since only the output signal from one side (positive side) of the coil port is used, compared with the signal output device of Patent Document 1, the received signal amounts of the high detection comparator and the low detection comparator are reduced by half. In a case where the received signal amount is smaller than a predetermined amount, the high detection comparator and the low detection comparator cannot react, which causes the signal output device to malfunction. Therefore, it is conceivable that a decrease in the received signal amounts due to a reduction in coil area in consideration of manufacturing costs and a reduction in transmission current for reducing power consumption cause the signal output device to malfunction. Even in a case where the received signal amount is small, it is preferable if the signal can be appropriately output.

An object of this invention is to provide a signal output device capable of appropriately outputting a signal even when a received signal amount is small.

Means for Solving the Problems

The invention relates to a signal output device which outputs a high peak and a low peak from a differential signal including a high signal and a low signal offset with a DC component, the signal output device including: a high-side comparator having an input terminal, of which one end is input with one of the high signal and the low signal and of which the other end is input with the other of the high signal and the low signal and detecting the high peak of the high signal; a low-side comparator having an input terminal, of which one end is input with one of the high signal and the low signal and of which the other end is input with the other of the high signal and the low signal and detecting the low peak of the low signal; a high-side AC coupling unit which is connected to one end of an input terminal of the high-side comparator and removes a DC component from one of the high signal and the low signal; a low-side AC coupling unit which is connected to one end of an input terminal of the low-side comparator and removes the DC component from one of the high signal and the low signal; and a threshold output unit which outputs a high-side threshold DC voltage combined with an output of the high-side AC coupling unit and outputs a low-side threshold DC voltage combined with an output of the low-side AC coupling unit, in which the high-side AC coupling unit is connected to an input terminal to which the low signal is input when the high-side threshold voltage is higher than the voltage of the DC component of the differential signal, and the high-side AC coupling unit is connected to an input terminal to which the high signal is input when the high-side threshold voltage is lower than the voltage of the DC component of the differential signal, and in which the low-side AC coupling unit is connected to an input terminal to which the high signal is input when the low-side threshold voltage is higher than the voltage of the DC component of the differential signal, and the low-side AC coupling unit is connected to an input terminal to which the low signal is input when the low-side threshold voltage is lower than the voltage of the DC component of the differential signal.

In addition, it is preferable that the signal output device further include a coil, of which one end outputs the high signal of the differential signal and of which the other end outputs the low signal of the differential signal.

In addition, it is preferable that the signal output device further include a latch circuit to which an output of the high-side comparator and an output of the low-side comparator are input.

In addition, it is preferable that the threshold output unit include a ladder resistor circuit, of which one end is connected to a DC power supply and of which the other end is grounded, and the ladder resistor circuit include a first contact point which outputs an intermediate voltage of a DC voltage as the DC component of the differential signal; a second contact point which outputs the high-side threshold voltage; and a third contact point which outputs the low-side threshold voltage.

In addition, it is preferable that the threshold output unit output the high-side threshold voltage higher than the DC component of the differential signal, and output the low-side threshold voltage lower than the DC component of the differential signal; the high-side AC coupling unit be connected to an inverting input terminal of the high-side comparator to which the low signal is input; and the low-side AC coupling unit be connected to a non-inverting input terminal of the low-side comparator to which the low signal is input.

In addition, it is preferable that the threshold output unit output the DC component of the differential signal to an upstream side of the high-side AC coupling unit and the low-side AC coupling unit and output the high-side threshold voltage and the low-side threshold voltage which are lower than the DC component of the differential signal and are the same voltage, the high-side AC coupling unit be connected to a non-inverting input terminal of the high-side comparator to which the high signal is input, and the low-side AC coupling unit be connected to a non-inverting input terminal of the low-side comparator to which the low signal is input.

In addition, it is preferable that the signal output device further include a plurality of switches connected to each of contact points other than the first contact point of the ladder resistor circuit; a control unit which switches the plurality of switches; and a detection circuit which detects an output of at least one of the high-side comparator and the low-side comparator, in which the control unit sequentially switch the plurality of switches from a contact point on a high voltage side or a low voltage side of the ladder resistor circuit and sets the contact point, which is to be connected to a switch on a lower voltage side than a switch at a position where an output detected by the detection circuit is inverted, as the second contact point and the third contact point.

Effects of the Invention

According to this invention, it is possible to provide a signal output device capable of appropriately outputting a signal even when a received signal amount is small.

PREFERRED MODE FOR CARRYING OUT THE INVENTION

Hereinafter, signal output devices according to embodiments of the invention will be described with reference to the drawings. First, an outline of the signal output device according to each embodiment will be described.

The signal output device is an output device that converts an analog signal into a digital signal and outputs the digital signal. The signal output device is, for example, a device used in a wireless communication technology between stacked chips (ThruChip interface (TCI)). The signal output device is used for a stacked chip (a stacked semiconductor chip such as a stacked DRAM) that performs wireless communication between stacked chips. Specifically, the signal output device is a device that outputs a signal received by using a coil as a digital signal.

First Embodiment

Figure 1:
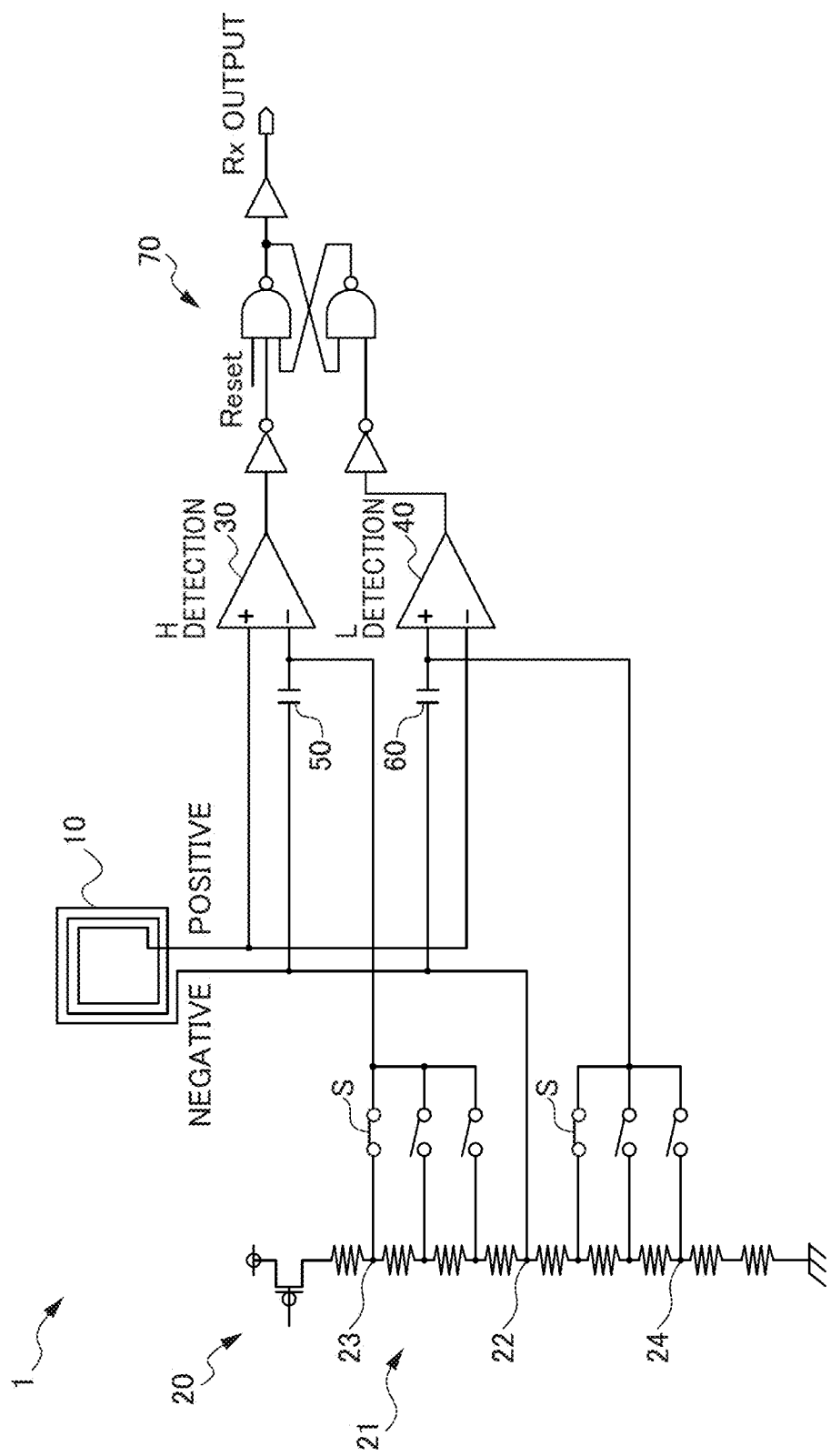
FIG. 1 is a schematic configuration diagram illustrating a signal output device according to a first embodiment of the invention.

Next, a signal output device 1 according to a first embodiment of the invention will be described with reference to FIGS. 1 and 2. The signal output device 1 according to the embodiment outputs a high peak and a low peak from a differential signal including a high signal and a low signal offset by a DC component. As illustrated in FIG. 1, the signal output device 1 includes a coil 10, a threshold output unit 20, a high-side comparator 30, a low-side comparator 40, a high-side AC coupling unit 50, and a low-side AC coupling unit 60, and a latch circuit 70.

The coil 10 receives a signal transmitted from the outside and outputs a differential signal from both ends. That is, the coil 10 has one end which outputs a high signal of the differential signal and the other end which outputs a low signal of the differential signal. Specifically, one end of the coil 10 is a positive port and the other end is a negative port. The coil 10 outputs the high signal from the positive port and outputs the low signal from the negative port. That is, the coil 10 outputs the differential signal including the high signal and the low signal. In the embodiment, a DC voltage from a threshold output unit 20 to be described later is applied to the coil 10. Therefore, the coil 10 outputs the differential signal including the high signal and the low signal offset by the DC component.

The high-side comparator 30 is a differential amplifier (OP Amp). In the high-side comparator 30, one of the high signal and the low signal is input to one end of the input terminal, and the other of the high signal and the low signal is input to the other end of the input terminal, so that the high peak of the high signal is detected. In the embodiment, a non-inverting input terminal of the high-side comparator 30 is connected to the positive port of the coil 10. An inverting input terminal of the high-side comparator 30 is connected to the negative port of the coil 10. That is, in the high-side comparator 30, the high signal is input to the non-inverting input terminal, and the low signal is input to the inverting input terminal.

The low-side comparator 40 is a differential amplifier (OP Amp). In the low-side comparator 40, one of the high signal and the low signal is input to one end of the input terminal and the other of the high signal and the low signal is input to the other end of the input terminal, so that the low peak of the low signal is detected. In the embodiment, the non-inverting input terminal of the low-side comparator 40 is connected to the negative port of the coil 10. The inverting input terminal of the low-side comparator 40 is connected to the positive port of the coil 10. That is, in the low-side comparator 40, the low signal is input to the non-inverting input terminal, and the high signal is input to the inverting input terminal.

The high-side AC coupling unit 50 is a condenser and is connected to one end of the input terminal of the high-side comparator 30. The high-side AC coupling unit 50 removes the DC component from one of the high signal and the low signal. That is, the high-side AC coupling unit 50 removes offset of one of the high signal and the low signal by removing the DC component. In the embodiment, the high-side AC coupling unit 50 is connected between the negative port of the coil 10 and the inverting input terminal of the high-side comparator 30. That is, the high-side AC coupling unit 50 removes the DC component from the low signal and outputs the DC-component-removed low signal to the inverting input terminal of the high-side comparator 30.

The low-side AC coupling unit 60 is a condenser and is connected to one end of the input terminal of the low-side comparator 40. The low-side AC coupling unit 60 removes the DC component from one of the high signal and the low signal. That is, the low-side AC coupling unit 60 removes offset of one of the high signal and the low signal by removing the DC component. In the embodiment, the low-side AC coupling unit 60 is connected between the negative port of the coil 10 and the non-inverting input terminal of the low-side comparator 40. That is, the low-side AC coupling unit 60 removes the DC component from the low signal and outputs the DC-component-removed low signal to the non-inverting input terminal of the low-side comparator 40.

The threshold output unit 20 outputs a high-side threshold voltage combined with the output of the high-side AC coupling unit 50 and outputs a low-side threshold voltage combined with the output of the low-side AC coupling unit 60. Specifically, the threshold output unit 20 combines a high-side threshold DC voltage with the high signal or the low signal from which the DC component has been removed by the high-side AC coupling unit 50 and outputs the high-side threshold DC voltage to the high-side comparator 30. In addition, the threshold output unit 20 combines a low-side threshold DC voltage with the high signal or the low signal from which the DC component has been removed by the low-side AC coupling unit 60 and outputs the low-side threshold DC voltage to the low-side comparator. In the embodiment, the threshold output unit 20 combines the high-side threshold DC voltage with the low signal from which the DC component has been removed by the high-side AC coupling unit 50 and inputs the high-side threshold DC voltage to the inverting input terminal of the high-side comparator 30. In addition, the threshold output unit 20 combines the low-side threshold DC voltage with the low signal from which the DC component has been removed by the low-side AC coupling unit 60 and inputs the low-side threshold DC voltage to the non-inverting input terminal of the low-side comparator 40. The threshold output unit 20 includes a ladder resistor circuit 21.

The ladder resistor circuit 21 has one end which is connected to a DC power supply and the other end which is grounded. The ladder resistor circuit 21 includes a first contact point 22, a second contact point 23, and a third contact point 24. In the ladder resistor circuit 21, each of the plurality of contact points other than the first contact point 22 is configured so as to be connectable via a switch S.

The first contact point 22 outputs an intermediate voltage of the DC power supply as a DC component of the differential signal. That is, the first contact point 22 is connected to a contact point that equally divides a resistance value of the ladder resistor circuit 21 into two. In the embodiment, the first contact point 22 is connected to the negative port of the coil 10.

The second contact point 23 outputs the high-side threshold voltage. The second contact point 23 is connected to a contact point different from the first contact point 22. In the embodiment, the second contact point 23 is a contact point between one end connected to the DC power supply and the first contact point 22. That is, the second contact point 23 outputs a DC voltage higher than that of the first contact point 22.

The third contact point 24 outputs the low-side threshold voltage. The third contact point 24 is connected to a contact point different from the first contact point 22. In the embodiment, the third contact point 24 is a contact point between the other end connected to the ground and the first contact point 22. That is, the third contact point 24 outputs a DC voltage lower than that of the first contact point 22.

According to the high-side AC coupling unit 50, the low-side AC coupling unit 60, and the threshold output unit 20 described above, it is determine which terminal of the high-side comparator 30 is to be connected to the high-side AC coupling unit 50 depending on whether the high-side threshold voltage is higher or lower than the voltage of the DC component of the differential signal. Specifically, the high-side AC coupling unit 50 is connected to the input terminal to which a low signal is input when the high-side threshold voltage is higher than the voltage of the DC component of the differential signal. On the other hand, the high-side AC coupling unit 50 is connected to the input terminal to which a high signal is input when the high-side threshold voltage is lower than the voltage of the DC component of the differential signal. That is, when the second contact point 23 of the ladder resistor circuit 21 is closer to the DC power supply than the first contact point 22, the high-side AC coupling unit 50 is connected to the input terminal to which the low signal of the high-side comparator 30 is input. On the other hand, when the second contact point 23 of the ladder resistor circuit 21 is closer to the ground side than the first contact point 22, the high-side AC coupling unit 50 is connected to the input terminal to which the high signal of the high-side comparator 30 is input.

In contrast, the low-side AC coupling unit 60 determines which terminal of the low-side comparator 40 is connected depending on whether the low-side threshold voltage is higher or lower than the voltage of the DC component of the differential signal. Specifically, the low-side AC coupling unit 60 is connected to the input terminal to which a high signal is input when the low-side threshold voltage is higher than the voltage of the DC component of the differential signal. On the other hand, the low-side AC coupling unit 60 is connected to the input terminal to which a low signal is input when the low-side threshold voltage is lower than the voltage of the DC component of the differential signal. That is, when the third contact point 24 of the ladder resistor circuit 21 is closer to the DC power supply than the first contact point 22, the low-side AC coupling unit 60 is connected to the input terminal to which the high signal of the low-side comparator 40 is input. On the other hand, when the third contact point 24 of the ladder resistor circuit 21 is closer to the ground side than the first contact point 22, the low-side AC coupling unit 60 is connected to the input terminal to which the low signal of the low-side comparator 40 is input.

The latch circuit 70 is input with the output of the high-side comparator 30 and the output of the low-side comparator 40. When a high signal is output from the high-side comparator 30, the latch circuit 70 outputs high and maintains the high state. When a high signal is output from the low-side comparator 40, the latch circuit outputs low and maintains the low state. The latch circuit 70 has a power-on reset input terminal for preventing malfunction during the operation and is reset when the operation starts.

Next, operations of the signal output device 1 according to this embodiment will be described. The threshold output unit 20 outputs the DC component from the first contact point 22 of the ladder resistor circuit 21 to the negative port of the coil 10. As a result, a potential corresponding to the voltage of the DC component is applied to the coil 10 in advance.

Figure 2:
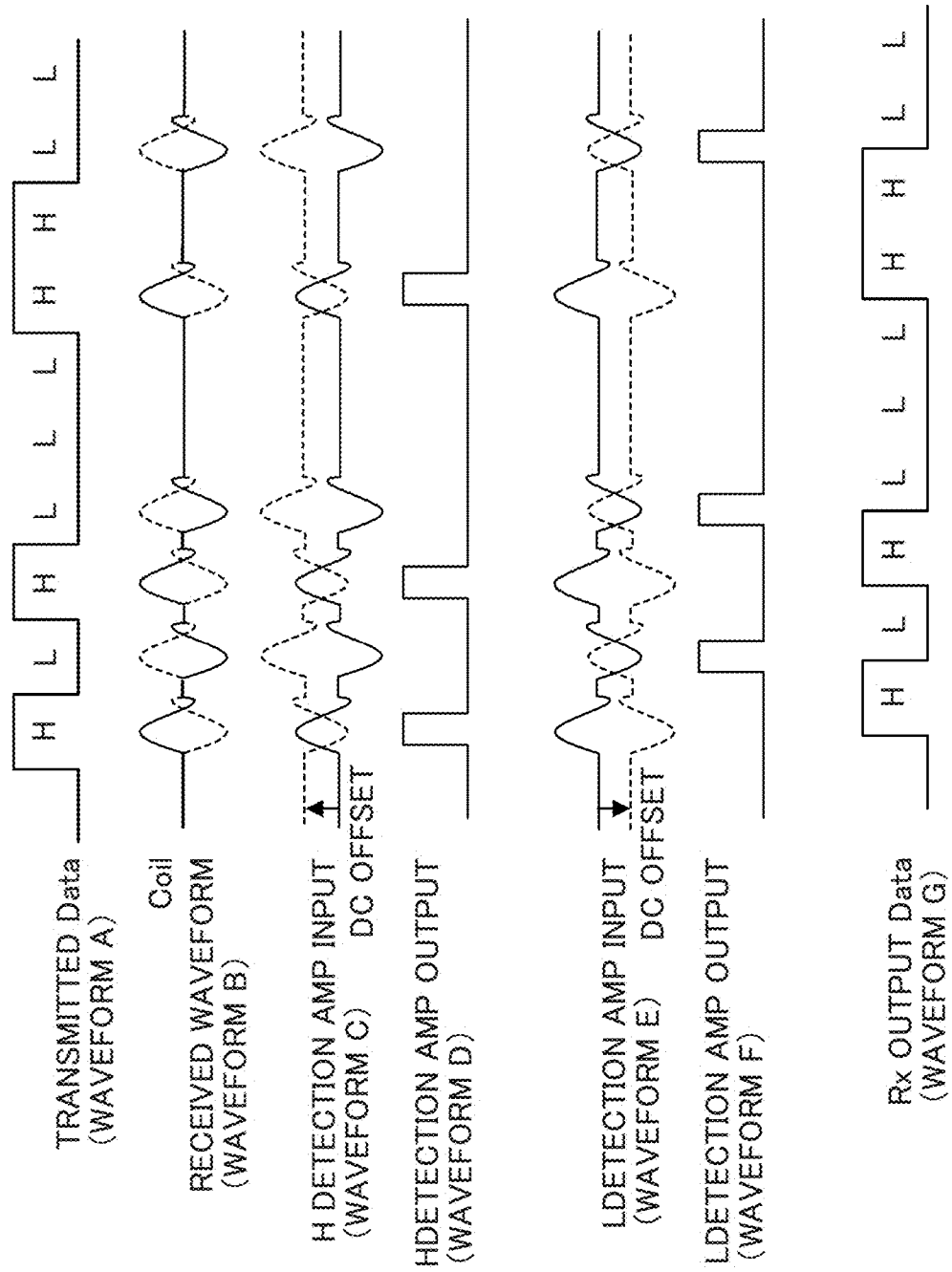
FIG. 2 illustrates a relationship between a signal input to and a signal output from the signal output device according to the first embodiment.

When the coil 10 receives a transmission data (waveform A) as illustrated in FIG. 2, a sine wave-like potential (waveform B) is generated in the coil 10 by changing the magnetic field at the time of switching between high and low. Specifically, at the time of switching to high, a positive potential is generated at the positive port of the coil 10, and a negative potential is generated at the negative port. On the other hand, at the time of switching to low, a negative potential is generated at the positive port of the coil 10, and a positive potential is generated at the negative port.

The high-side comparator 30 receives an input signal having a waveform C. Herein, the solid line of the waveform C indicates a signal input to the non-inverting input terminal, and the dotted line of the waveform C indicates a signal input to the inverting input terminal. The signal input to the inverting input terminal is combined with the high-side threshold voltage output from the threshold output unit 20 after the DC component is removed by the high-side AC coupling unit 50. As a result, the potential of the signal (low signal) input to the inverting input terminal increases by the difference between the DC component of the differential signal and the high-side threshold voltage. The high-side comparator 30 outputs high in a case where the signal (high signal) input to the non-inverting input terminal is higher than the signal (low signal) input to the inverting input terminal. The signal (low signal) input to the inverting input terminal is a combined signal of the low signal from which the DC component is removed and the high-side threshold voltage (DC). Then, the combined signal functions as a threshold value for the high-side comparator 30. The combined signal has a relation of a phase opposite to that of the signal input to the non-inverting input terminal (waveform C). Therefore, in a case where the signal input to the non-inverting input terminal rises, the combined signal that functions as a threshold value falls, and thus, the high-side comparator 30 can accurately detect the high state even through the signal input to the non-inverting input terminal has a small amplitude. Therefore, the high-side comparator 30 outputs high at the time of the high peak without being affected by noise as in the waveform D.

An input signal having a waveform E is input to the low-side comparator 40. Herein, the solid line of the waveform E indicates a signal input to the inverting input terminal, and the dotted line of the waveform E indicates a signal input to the non-inverting input terminal. After the DC component is removed from the signal input to the non-inverting input terminal by the low-side AC coupling unit 60, and then, the low-side threshold voltage output from the threshold output unit 20 is combined. As a result, the potential of the signal (low signal) input to the non-inverting input terminal decreases by the difference between the DC component of the differential signal and the low-side threshold voltage. The low-side comparator 40 outputs high when the signal (low signal) input to the non-inverting input terminal is higher than the signal (high signal) input to the inverting input terminal. A signal (low signal) input to the non-inverting input terminal is a combined signal of the low signal from which the DC component is removed and the low-side threshold voltage (DC). Then, the combined signal functions as a threshold value for the low-side comparator 40. The combined signal has a relation of a phase opposite to that of the signal input to the inverting input terminal (waveform E). Therefore, in a case where the signal input to the inverting input terminal falls, the combined signal that functions as a threshold value rises, and thus, the low-side comparator 40 can accurately detect the low state even though the signal input to the inverting input terminal has a small amplitude. Therefore, the low-side comparator 40 outputs high at the low peak without being affected by noise as in the waveform F.

The latch circuit 70 outputs high when the output of the high-side comparator 30 is switched to high, and the latch circuit 70 outputs low when the output of the low-side comparator 40 is switched to high. That is, the latch circuit 70 outputs a signal having such a waveform G. That is, the signal output device 1 outputs a signal represented by the same waveform G as the signal represented by the waveform A.

According to the signal output device 1 according to the first embodiment described above, the following effects can be obtained.

(1) The signal output device 1 is configured to include the high-side comparator 30 having an input terminal, of which one end is input with one of the high signal and the low signal and of which the other end is input with the other of the high signal and the low signal and detecting the high peak of the high signal; the low-side comparator 40 having an input terminal, of which one end is input with one of the high signal and the low signal and of which the other end is input with the other of the high signal and the low signal and detecting the low peak of the low signal; the high-side AC coupling unit 50 which is connected to one end of an input terminal of the high-side comparator 30 and removes a DC component from one of the high signal and the low signal; the low-side AC coupling unit 60 which is connected to one end of an input terminal of the low-side comparator 40 and removes a DC component from one of the high signal and the low signal; and the threshold output unit 20 which outputs a high-side threshold voltage combined with the output of the high-side AC coupling unit 50 and outputs a low-side threshold voltage combined with the output of the low-side AC coupling unit 60. The high-side AC coupling unit 50 is connected to the input terminal to which the low signal is input when the high-side threshold voltage is higher than the voltage of the DC component of the differential signal and is connected to the input terminal to which the high signal is input when the high-side threshold voltage is lower than the voltage of the DC component of the differential signal. The low-side AC coupling unit 60 is connected to the input terminal to which the high signal is input when the low-side threshold voltage is higher than the voltage of the DC component of the differential signal and is connected to the input terminal to which the low signal is input when the low-side threshold voltage is lower than the voltage of the DC component of the differential signal. Accordingly, the threshold value at which the high-side comparator 30 outputs high can be changed according to the waveform of the low signal, and the threshold value at which the low-side comparator 40 outputs high is changed according to the waveform of the high signal. Therefore, the low peak becomes the threshold value during the high peak, and the high peak becomes the threshold value during the low peak, so that even in a case where the received signal amount is small, it is possible to appropriately output the signal while suppressing malfunction caused by noise.

(2) The signal output device 1 is configured to further include the coil 10, of which one end outputs the high signal of the differential signal and of which the other end outputs the low signal of the differential signal. As a result, a signal output circuit can be configured as a TCI receiving circuit.

(3) The signal output device 1 is configured to further include the latch circuit 70 to which the output of the high-side comparator 30 and the output of the low-side comparator 40 are input. As a result, when the output from the high-side comparator 30 is switched to high and when the output from the low-side comparator 40 is switched to high, the signal output from the latch circuit 70 is switched between high and low. Therefore, even in a case where the received signal amount is small, it is possible to appropriately reproduce the received signal.

(4) The threshold output unit 20 is configured to include the ladder resistor circuit 21 having one end which is connected to a DC power supply and the other end which is grounded. The ladder resistor circuit 21 is configured to include the first contact point 22 which outputs the intermediate voltage of the DC voltage as the DC component of the differential signal, the second contact point 23 which outputs the high-side threshold voltage, and the third contact point 24 which outputs the low-side threshold voltage. As a result, it is possible to control the DC component that offsets the differential signal and to output a threshold voltage which is appropriate for the received signal amount.

(5) The threshold output unit 20 outputs the high-side threshold voltage higher than the DC component of the differential signal and outputs the low-side threshold voltage lower than the DC component of the differential signal, and thus, the high-side AC coupling unit 50 is connected to the inverting input terminal of the high-side comparator 30 to which the low signal is input, and the low-side AC coupling unit 60 is connected to the non-inverting input terminal of the low-side comparator 40 to which the low signal is input. As a result, the voltage value of the low signal is changed by the difference between the high-side threshold voltage and the low-side threshold voltage with respect to the voltage of the DC signal of the differential signal, so that it is possible to appropriately output the signal without being affected by noise.

Second Embodiment

Next, a signal output device 1A according to a second embodiment of the invention will be described with reference to FIG. 3. In the description of the second embodiment, the same components are denoted by the same reference numerals, and the description thereof is omitted or simplified. The signal output device 1A according to the second embodiment is different from the first embodiment in terms of connection between a ladder resistor circuit 21A and the coil 10 and the like.

The high-side comparator 30 has a non-inverting input terminal connected to the positive port of the coil 10 and an inverting input terminal connected to the negative port of the coil 10. The low-side comparator 40 has a non-inverting input terminal connected to the negative port of the coil 10 and an inverting input terminal connected to the positive port of the coil 10.

The high-side AC coupling unit 50 is connected to the non-inverting input terminal of the high-side comparator 30. The low-side AC coupling unit 60 is connected to the non-inverting input terminal of the low-side comparator 40.

A threshold output unit 20A outputs the DC component of the differential signal to an upstream side of the high-side AC coupling unit 50 and the low-side AC coupling unit 60. Specifically, a first contact point 22A of the ladder resistor circuit 21A is connected to each of the positive port and the negative port of the coil 10 via a resistor R1. The threshold output unit 20A outputs the high-side threshold voltage and the low-side threshold voltage that are lower than the DC component of the differential signal and are the same voltage. Specifically, the ladder resistor circuit 21A outputs the high-side threshold voltage and the low-side threshold voltage from a second contact point 23A and a third contact point 24A, which are closer to the ground side than the first contact point 22A and are the same contact points. The second contact point 23A and the third contact point 24A of the ladder resistor circuit 21A are connected to each of the non-inverting input terminals of the high-side comparator 30 and the low-side comparator 40 via a resistor R2.

According to the signal output device according to the embodiment described above, the following effects can be obtained in addition to the effects (1) to (5) of the first embodiment described above.

(6) The threshold output unit 20A outputs the DC component of the differential signal to an upstream side of the high-side AC coupling unit 50 and the low-side AC coupling unit 60 and outputs the high-side threshold voltage and the low-side threshold voltage which are lower than the DC component of the differential signal and are the same voltage. In addition, the high-side AC coupling unit 50 is connected to the non-inverting input terminal of the high-side comparator 30 to which the high signal is input, and the low-side AC coupling unit 60 is connected to the non-inverting input terminal of the low-side comparator 40 to which the low signal is input. As a result, the voltage value of the high-side threshold voltage and the voltage value of the low-side threshold voltage become the same voltage, so that the potential difference shifted between the low signal and the high signal in the high-side comparator 30 and the low-side comparator 40 becomes equal. Therefore, it is possible to allow it difficult to generate a duty shift caused by the amplification time of the differential signal in the high-side comparator 30 and the low-side comparator 40.

Third Embodiment

Next, a signal output device 1B according to a third embodiment of the invention will be described with reference to FIG. 4. In the description of the third embodiment, the same components are denoted by the same reference numerals, and the description thereof is omitted or simplified. The signal output device 1B according to the third embodiment is different from the second embodiment in that the signal output device 1B includes a plurality of switches SB, a control unit 80, and a detection circuit 90.

The plurality of switches SB are connected to the respective contact points including the first contact point 22A of the ladder resistor circuit 21A. A pair of the switches SB are provided for each contact point. Each of the pair of switches is connected to the non-inverting input terminals of the high-side comparator 30 and the low-side comparator 40. That is, each of the pair of switches is connected so that the second contact point 23A and the third contact point 24A are the same contact point. Similarly, to the second embodiment, in addition to the switch SB, the first contact point 22A is connected to each of the positive port and the negative port of the coil 10 via the resistor R1.

The control unit 80 switches the plurality of switches SB. Specifically, by switching the plurality of switches SB, the control unit 80 switches the second contact point 23A and the third contact point 24A and, thus, switches the high-side threshold voltage and the low-side threshold voltage output to the high-side comparator 30 and the low-side comparator 40.

The detection circuit 90 detects the output of at least one of the high-side comparator 30 and the low-side comparator 40. In the embodiment, the detection circuit 90 is connected to both the outputs of the high-side comparator 30 and the low-side comparator 40, respectively.

Next, operations of the signal output device 1B according to this embodiment will be described. First, when a power-on reset signal of the latch circuit 70 is input, a DC component is output from the threshold output unit 20A to the coil 10. Then, the control unit 80 sequentially switches the plurality of switches SB from the contact point on the high voltage side or the low voltage side of the ladder resistor circuit 21A. The detection circuit 90 outputs a detection signal to the control unit 80 when detecting the switching of the output from low to high or high to low of the high-side comparator 30 and the low-side comparator 40.

When the control unit 80 receives the detection signal, the control unit 80 sets the contact points, which are to be connected to the switch on the lower voltage side than the switch at the position where the output detected by the detection circuit 90 is inverted, as the second contact point 23A and the third contact point 24A. For example, the control unit 80 sets contact points, which have a voltage one code to two codes lower than the switch at the position where the output detected by the detection circuit 90 is inverted, as the second contact point 23A and the third contact point 24A. Accordingly, the signal output device 1B can receive a signal.

According to the signal output device 1B according to the embodiment described above, the following effects can be obtained in addition to the effects (1) to (4) and (6) of the first embodiment described above.

(7) The signal output device 1B further includes a control unit 80 which switches the plurality of switches SB and a detection circuit 90 which detects an output of at least one of the high-side comparator 30 and the low-side comparator 40. In addition, the control unit 80 sequentially switches the plurality of switches SB from a contact point on the high voltage side or the low voltage side of the ladder resistor circuit 21A and sets the contact point, which is to be connected to a switch on a lower voltage side than a switch at a position where an output detected by the detection circuit 90 is inverted, as the second contact point 23A and the third contact point 24A. Accordingly, it is possible to set the appropriate high-side threshold voltage and the appropriate low-side threshold voltage according to the signal amount received by the coil 10 while canceling the input DC offset of the high-side comparator 30 and the low-side comparator 40. Therefore, it is possible to improve an operation margin of a signal processing device.

The preferred embodiments of the signal output device of the invention have been described above, but the invention is not limited to the above-described embodiments and can be modified as appropriate.

For example, the connection of the coil 10, the high-side AC coupling unit 50, and the threshold output unit 20 and 20A to the high-side comparator 30 in the above-described embodiment is not limited thereto. In addition, the connection of the coil 10, the low-side AC coupling unit 60, and the threshold output units 20 and 20A to the low-side comparator 40 is not limited thereto. That is, the high-side AC coupling unit 50 may be connected to the input terminal of the high-side comparator 30 to which the low signal is input when the high-side threshold voltage is higher than the voltage of the DC component of the differential signal. In addition, the high-side AC coupling unit 50 may be connected to the input terminal of the high-side comparator 30 to which a high signal is input when the high-side threshold voltage is lower than the voltage of the DC component of the differential signal.

In addition, the low-side AC coupling unit 60 may be connected to the input terminal of the low-side comparator 40 to which a high signal is input when the low-side threshold voltage is higher than the voltage of the DC component of the differential signal. In addition, the low-side AC coupling unit 60 may be connected to the input terminal to which a low signal is input when the low-side threshold voltage is lower than the voltage of the DC component of the differential signal.

Figure 3:
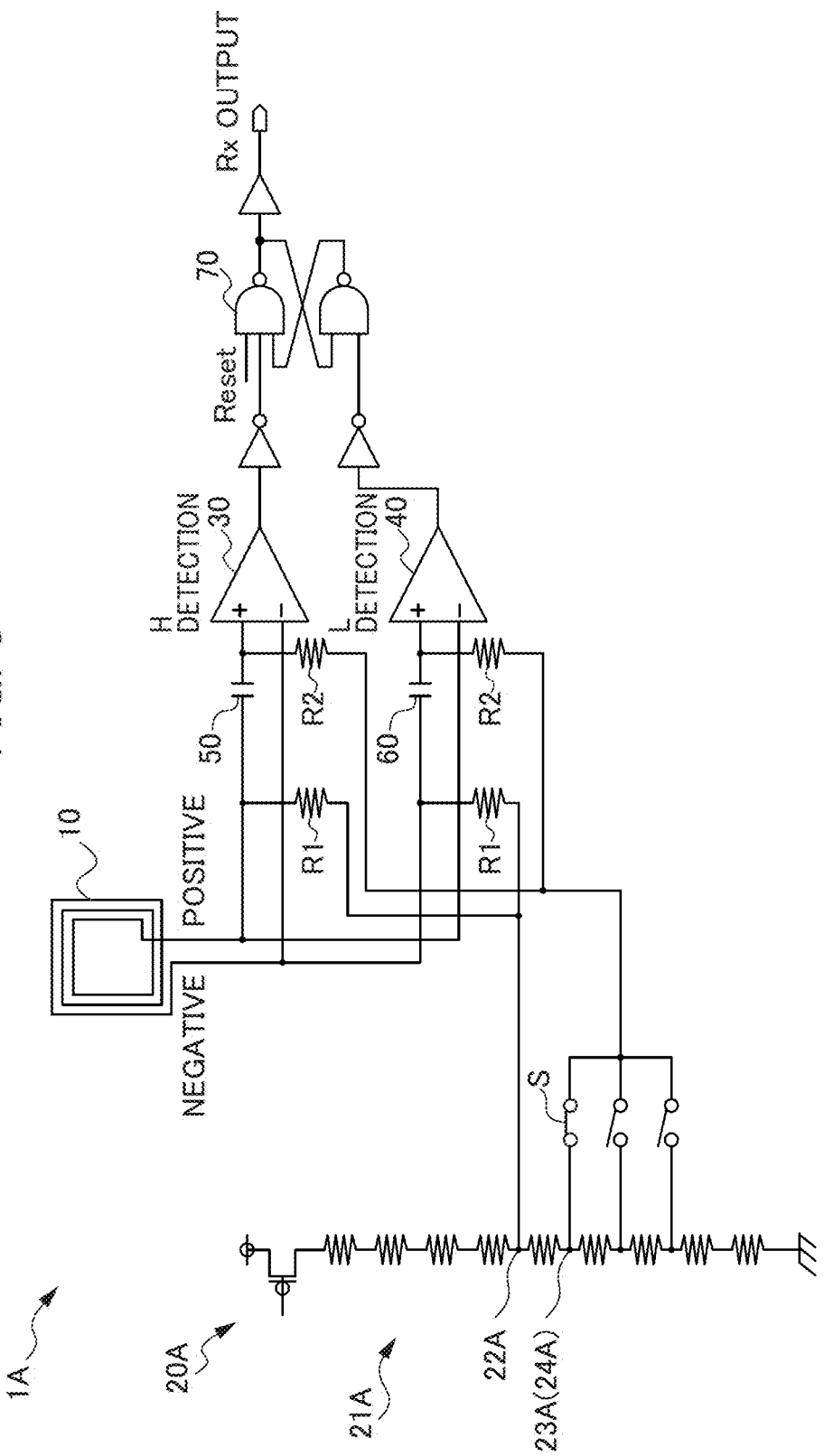
FIG. 3 is a schematic configuration diagram illustrating a signal output device according to a second embodiment of the invention.
Figure 4:
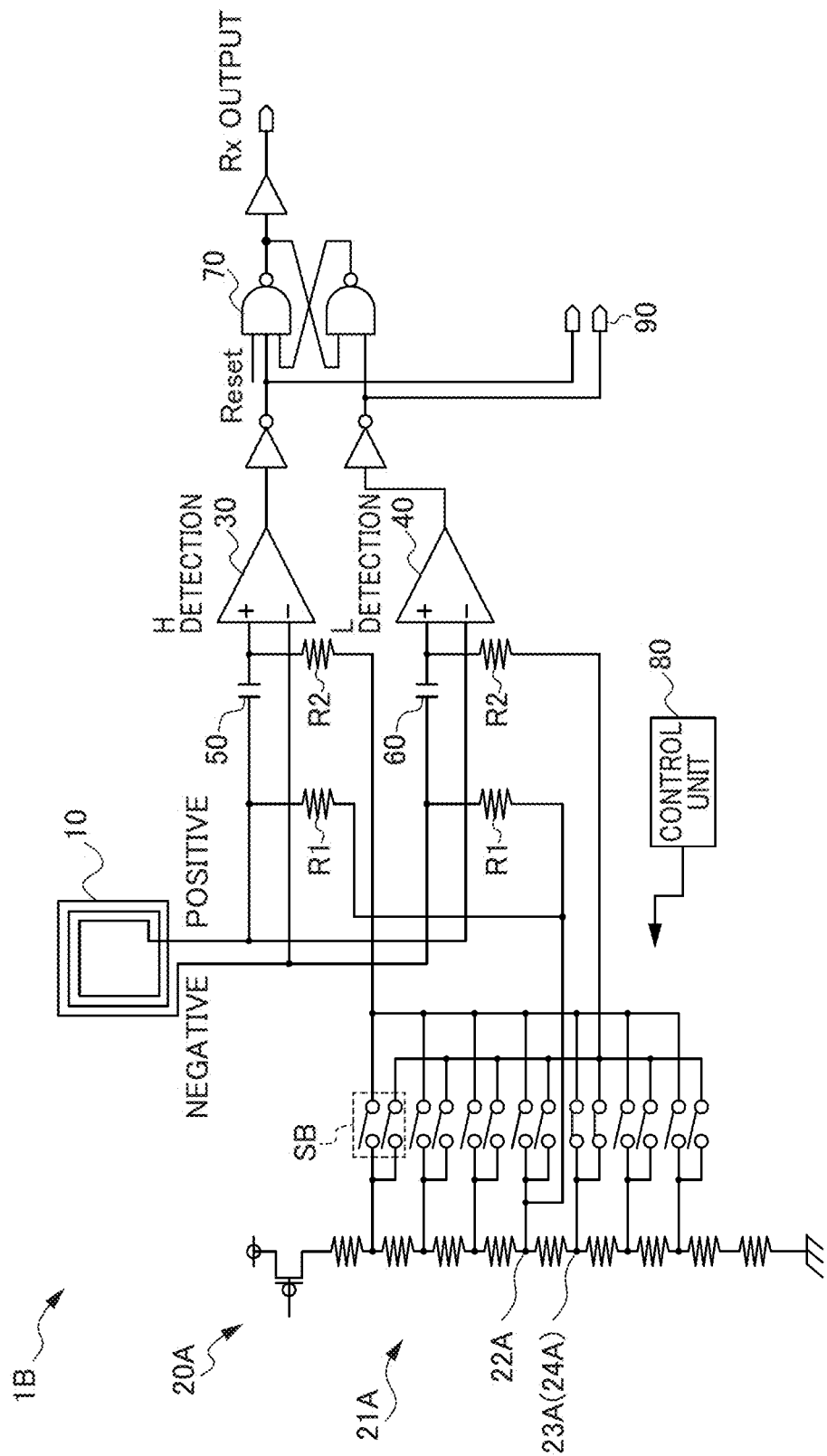
FIG. 4 is a schematic configuration diagram illustrating a signal output device according to a third embodiment of the invention.

In addition, in the first and second embodiments, as illustrated in FIGS. 3 and 4, the switch is provided for each contact point of the ladder resistor circuit 21, and the switch is switched according to the received signal amount, so that the second contact point 23 and the third contact point 24 may be configured to be switchable.

In addition, in the above-described embodiments, although the aspect which the signal is received by using the coil 10 is described, the invention is not limited thereto. That is, other configurations may be used as long as a differential signal offset with a DC component can be input.

EXPLANATION OF REFERENCE NUMERALS 1, 1A, 1B SIGNAL OUTPUT DEVICE
10 COIL
20, 20A THRESHOLD OUTPUT UNIT
21, 21A LADDER RESISTOR CIRCUIT
22, 22A FIRST CONTACT POINT
23, 23A SECOND CONTACT POINT
24, 24A THIRD CONTACT POINT
30 HIGH-SIDE COMPARATOR
40 LOW-SIDE COMPARATOR
50 HIGH-SIDE AC COUPLING UNIT
60 LOW-SIDE AC COUPLING UNIT
80 CONTROL UNIT
90 DETECTION CIRCUIT
SB PLURALITY OF SWITCHES

The invention claimed is:

1. A signal output device which outputs a high peak and a low peak from a differential signal including a high signal and a low signal offset with a DC component, the signal output device comprising:
   a high-side comparator having an input terminal, of which one end is input with one of the high signal and the low signal and of which the other end is input with the other of the high signal and the low signal and detecting the high peak of the high signal;
   a low-side comparator having an input terminal, of which one end is input with one of the high signal and the low signal and of which the other end is input with the other of the high signal and the low signal and detecting the low peak of the low signal;
   a high-side AC coupling unit which is connected to one end of an input terminal of the high-side comparator and removes a DC component from one of the high signal and the low signal;
   a low-side AC coupling unit which is connected to one end of an input terminal of the low-side comparator and removes the DC component from one of the high signal and the low signal; and
   a threshold output unit which outputs a high-side threshold DC voltage combined with an output of the high-side AC coupling unit and outputs a low-side threshold DC voltage combined with an output of the low-side AC coupling unit,
   wherein the high-side AC coupling unit is connected to an input terminal to which the low signal is input when the high-side threshold voltage is higher than the voltage of the DC component of the differential signal, and the high-side AC coupling unit is connected to an input terminal to which the high signal is input when the high-side threshold voltage is lower than the voltage of the DC component of the differential signal, and
   wherein the low-side AC coupling unit is connected to an input terminal to which the high signal is input when the low-side threshold voltage is higher than the voltage of the DC component of the differential signal, and the low-side AC coupling unit is connected to an input terminal to which the low signal is input when the low-side threshold voltage is lower than the voltage of the DC component of the differential signal.

2. The signal output device according to claim 1, further comprising a coil, of which one end outputs the high signal of the differential signal and of which the other end outputs the low signal of the differential signal.

3. The signal output device according to claim 1, further comprising a latch circuit to which an output of the high-side comparator and an output of the low-side comparator are input.

4. The signal output device according to claim 1,
   wherein the threshold output unit includes a ladder resistor circuit, of which one end is connected to a DC power supply and of which the other end is grounded, and
   wherein the ladder resistor circuit includes:
   a first contact point which outputs an intermediate voltage of a DC voltage as the DC component of the differential signal;
   a second contact point which outputs the high-side threshold voltage; and
   a third contact point which outputs the low-side threshold voltage.

5. The signal output device according to claim 1,
   wherein the threshold output unit outputs the high-side threshold voltage higher than the DC component of the differential signal, and outputs the low-side threshold voltage lower than the DC component of the differential signal,
   wherein the high-side AC coupling unit is connected to an inverting input terminal of the high-side comparator to which the low signal is input, and
   wherein the low-side AC coupling unit is connected to a non-inverting input terminal of the low-side comparator to which the low signal is input.

6. The signal output device according to claim 1,
   wherein the threshold output unit outputs the DC component of the differential signal to an upstream side of the high-side AC coupling unit and the low-side AC coupling unit and outputs the high-side threshold voltage and the low-side threshold voltage which are lower than the DC component of the differential signal and are the same voltage,
   wherein the high-side AC coupling unit is connected to a non-inverting input terminal of the high-side comparator to which the high signal is input, and
   wherein the low-side AC coupling unit is connected to a non-inverting input terminal of the low-side comparator to which the low signal is input.

7. The signal output device according to claim 4, further comprising:
   a plurality of switches connected to each of contact points including the first contact point of the ladder resistor circuit;
   a control unit which switches the plurality of switches; and
   a detection circuit which detects an output of at least one of the high-side comparator and the low-side comparator,
   wherein the control unit sequentially switches the plurality of switches from a contact point on a high voltage side or a low voltage side of the ladder resistor circuit and sets the contact point, which is to be connected to a switch on a lower voltage side than a switch at a position where an output detected by the detection circuit is inverted, as the second contact point and the third contact point.

* * * * *